United States Patent [19]

Barbknecht et al.

[11] Patent Number: 4,570,262

[45] Date of Patent: Feb. 11, 1986

[54] PROGRAMMABLE UNIVERSAL LOGIC DRIVER

[75] Inventors: Gary D. Barbknecht, Ardmore, Tenn.; Buford E. Terrell, Huntsville, Ala.

[73] Assignee: The Boeing Company, Seattle, Wash.

[21] Appl. No.: 506,632

[22] Filed: Jun. 22, 1983

[51] Int. Cl.[4] .................................... G01R 31/28
[52] U.S. Cl. ................................. 371/20; 324/73 R
[58] Field of Search .............. 371/20, 15; 324/73 R, 324/73 AT

[56] References Cited

U.S. PATENT DOCUMENTS

| | | | |
|---|---|---|---|
| 3,832,535 | 8/1974 | De Vito | 371/20 |
| 4,092,589 | 5/1978 | Chau et al. | 324/73 R |
| 4,102,491 | 7/1978 | De Vito et al. | 371/20 |
| 4,348,759 | 9/1982 | Schnurmann | 371/20 |
| 4,439,858 | 3/1984 | Petersen | 371/20 |

*Primary Examiner*—Charles E. Atkinson
*Attorney, Agent, or Firm*—Edwin H. Crabtree

[57] ABSTRACT

A programmable universal logic driver for handling various voltage combinations encountered in computer logic testing of a unit under test. The logic driver fits in both single ended and differential applications and provides for external voltage control, variable voltage drive, tristate or electronic "off" and limiting of output current.

5 Claims, 2 Drawing Figures

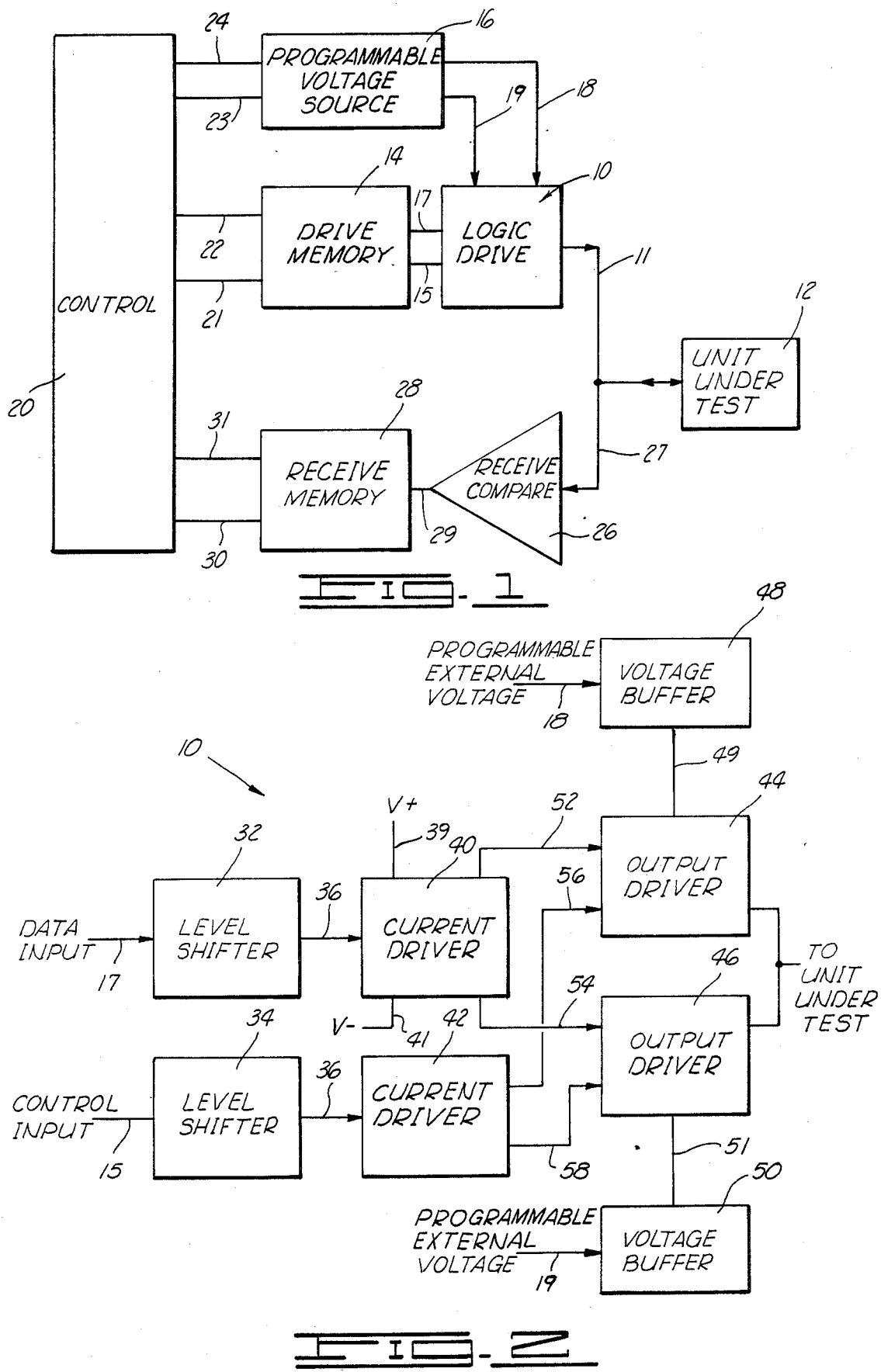

PROGRAMMABLE UNIVERSAL LOGIC DRIVER

BACKGROUND OF THE INVENTION

This invention relates broadly to a programmable universal logic driver for computer logic testing and more narrowly but not by way of limitation to a logic driver for handling various voltage combinations encountered between a microprocessor control and a unit under test.

Heretofore, there has been no single interface driver circuit used with automated test systems which can handle all present logic families and special requirements for set up of a unit under test. For example, CMOS uses supply voltages from −12 VDC to +12 VDC with 12 volt changes from "Hi" to "Lo" states. ECL requires 0 VDC and −5.2 VDC with 1 volt changes while TTL uses 0 VDC and +5 VDC supply voltage with 2.5 to 4 volt changes from "Hi" to "Lo" states. Microprocessor designs require bi-directional signals and driver "tri-state" or electronic "off" states.

Because of the above, extremely complex interface circuitry has been developed which has not been able to be quickly, conveniently and reliably connected and able to drive all of the present logic families. This problem is compounded as new families of logic are developed such as $I^2L$, where currents, not voltages are used to effect logic changes.

Previous circuit designs have been able to cover some but not all of the logic family parameters. Designs that have totem-pole logic outputs are bias sensitive and can handle only positive variations in voltage swing or small excursion positive to negative voltage swings but not all combinations of voltage limits because the input drive to this circuit varies as the output driver voltage bias is moved. This causes the circuits to not work when some combination is encountered that changes the driver biasing cutting off a stage that needs to be on. Adding shut-off stages for tri-state further complicates this bias problem. Most equipment today uses a mixture of driver designs or requires circuit board changes to provide test capability for all logic types. No single design has been found to handle all requirements for voltage or current drive to suit all requirements.

In U.S. Pat. No. 3,597,682 to Hubbs et al, U.S. Pat. No. 3,832,535 to DeVito, U.S. Pat. No. 4,070,565 to Borrelli, U.S. Pat. No. 4,102,491 to DeVito et al, U.S. Pat. No. 4,108,358 to Niemaszyk et al, U.S. Pat. No. 4,285,059 to Burlage et al, U.S. Pat. No. 4,291,404 to Steiner and U.S. Pat. No. 4,335,457 to Early various programmable power supply and digital logic devices are disclosed. None of the disclosures in these prior art patents specifically provide the unique features and advantages of the subject programmable universal logic driver as described herein.

SUMMARY OF THE INVENTION

The subject programmable universal logic driver provides means for handling various voltage combinations encountered in logic testing. The logic driver provides for external control, variable voltage drive, tri-state or off and output current limitations. The invention also will fit into both single ended and differential applications.

The programmable logic driver presented requires no external relay to disable the driver for receive mode switching. Further the circuit application requires no series FET switch for real time switching for response catching from the unit under test.

Series connection of an FET switch also has an inherent limitation on the voltage range that it can control. The subject logic driver uses a totem-pole circuit that is configured to provide a true Tri-State or "Off" condition that requires no additional series components as does prior art configurations.

The programmable universal logic driver for handling various voltage combinations encountered in computer logic testing between the microprocessor control and an unit under test includes a first and second voltage level shifter adapted for connections to the microprocessor control for receiving shifting and data input drive voltage levels. The level shifters are connected to a first and second current driver. The current drivers are connected to a first and second output driver which are also adapted for receiving programmable external voltage from the microprocessor. The first and second current drivers are connected to the unit under test.

The advantages and objects of the invention will become evident from the following detailed description of the drawings when read in connection with the accompanying drawings which illustrate preferred embodiments of the invention.

BRIEF DESCRIPTION OF THE DRAWINGS

FIG. 1 is a block diagram of a typical logic tester including the logic driver.

FIG. 2 illustrates a block diagram of the programmable universal logic driver.

DETAILED DESCRIPTION OF THE DRAWINGS

In FIG. 1 a typical application of the logic driver designated by general reference numeral 10 is shown in an automatic test system. The logic driver 10 provides an interface via lead 11 between a unit under test 12 and a drive memory 14 via leads 15 and 17 which is preloaded with a test pattern to be sent to the unit under test 12. Programmable drive voltages from a programmable voltage source 16 provides a voltage source for the logic driver 10 via leads 18 and 19. The drive memory 14 and the programmable voltage source 16 are connected to a microprocessor control 20 via leads 21, 22, 23 and 24. The programmable voltage source 16 provides the voltage source for the logic driver 10 which determines the extremes which are sent to the unit under test 12 for "Hi" and "Lo" states. The programmable voltage source 16 can be changed to suit the logic type in the unit under test for both operation and limit testing. The control 20 can be locally or remotely directed to change each of the conditions and patterns in the drive memory 14. Also the unit under test 12 is connected to a receive compare 26 via lead 27. The receive compare 26 is connected to a receive memory 28 via lead 29. The memory 28 is connected to the control 20 via leads 30 and 31.

In FIG. 2 the logic driver 10 includes a first level shifter 32 for receiving data input from the microprocessor control 20 and a second level shifter 34 for receiving tri-state or off control from the microprocessor 20. The driver 10 also includes a first current driver 40, a second current driver 42, a first output driver 44, a second output driver 46 and voltage buffers 48 and 50. Both the voltage buffers 48 and 50 receive programmable external voltage via leads 18 and 19 from the programmable voltage source 16 shown in FIG. 1.

The first and second level shifter 32 and 34 provide a means for shifting the input driver voltage level from data and tri-state control from TTL (0 to 5 volts), CMOS (0 to 12 volts or −6 volts to +6 volts) or other potential driving source family types to the supply levels used in the current drivers 40 and 42 via leads 36 and 38. The level shifter circuits 32 and 34 may consist of a common emitter stage or an emitter follower for high voltage swing and low impedance drive to the current drivers 40 and 42.

The first current driver receives a positive voltage via lead 39 and a negative voltage via lead 41 from an external source. The positive and negative voltage supply must be larger than the output of the logic driver 10 to hold the output drivers 44 and 46 in a completely "ON" or "OFF" condition.

The current drivers 40 and 42 use a dual emitter follower pair for high current drive to rapidly sweep charge from the inputs to the output drivers 44 and 46. The first current driver 40 provides an inverting transistor for complementary drive to output drivers 44 and 46 via leads 52 and 54 for alternately pulling positive and negative voltage but not simultaneously.

The second current driver 42 provides a polarity of signals to simultaneously shut-off both the output drivers 44 and 46 via leads 56 and 58 and to disable or tri-state the output of the logic driver 10 to the unit under test 12.

The output drivers 44 and 46 may be a transistor type which can handle input over drive without break down or degradation. For example, the subject logic driver 10 uses a newly developed power VMOS transistor connected in a standard totem-pole configuration for fast rise and fall characteristics.

The voltage buffers 48 and 50 connected to the drivers 44 and 46 via leads 49 and 51 may be used with the logic driver 10 and have been found to be a protection for the system in which the logic driver 10 is implemented. The buffers 48 and 50 isolate the reference voltage source from noise and extraneous signals at the unit under test interface and provide current limiting to protect the unit under test from burn-up in the event of an incorrect connection.

The programmable universal logic driver 10 is not confined only to test system applications and it can be used equally well in various logic driver applications which call for general purpose variable output. Further current limit protection is optional but can be easily added to the output of the logic driver 10.

Also the logic driver 10 provides for interfacing to all known types of logic in a single circuit set. Tri-State or High Impedance capability is provided within the same universal circuit capable of ON/OFF and OFF/ON response at microprocessor speeds. Further single-ended or double-ended operation is possible with the logic driver 10 by driving two single or parallel connected drivers 10.

Changes may be made in the construction and arrangement of the parts or elements of the embodiments as described herein without departing from the spirit or scope of the invention defined in the following claims.

What is claimed is:

1. A programmable universal logic driver for handling various voltage combinations encountered in computer logic testing between a microprocessor control and a unit under test, the logic driver comprising:
   a first voltage level shifter adapted for connection to the microprocessor control for shifting a data input drive voltage, the first shifter having a common emitter stage and emitter follower for high voltage swing and low impedance drive;
   a second voltage level shifter adapted for connection to the microprocessor control for shifting a tri-state input control, the second shifter including a common emitter stage and emitter follower for high voltage swing and low impedance drive;
   a first current driver connected to the first level shifter, the first current driver receiving positive and negative voltage from an external source, the positive and negative voltage source greater than the voltage output received from the first level shifter;
   a second current driver connected to the second level shifter, the first and second current drivers including a dual emitter follower for high current drive to rapidly sweep current output;
   a first transistor output driver connected to the first and second current drivers, the first transistor output driver adapted for receiving programmable voltage from the microprocessor; and
   a second transistor output driver connected to the first and second current drivers, the first and second transistor output drivers adapted for connection to the unit under test, the second transistor output driver adapted for receiving programmable external voltage from the microprocessor control.

2. The logic driver as described in claim 1 wherein the first current driver includes an inverting transistor for complementary drive to the first and second output drivers and alternately pulling positive and negative voltage but not simultaneously.

3. The logic driver as described in claim 1 wherein the transistors are a power VMOS transistor connected in a standard totem-pole for fast rise and fall characteristics.

4. The logic driver as described in claim 1 further including a first voltage buffer connected between the first output driver and the programmable voltage source and a second voltage buffer connected between the second output driver and the programmable voltage source.

5. The logic driver as described in claim 1 wherein the second current driver provides a polarity of signals to simultaneously shut off both the output drivers and to disable or tri-state the output of the logic driver.

* * * * *